United States Patent [19]

Hopf et al.

[11] Patent Number: 4,857,435
[45] Date of Patent: Aug. 15, 1989

[54] POSITIVE PHOTORESIST THERMALLY STABLE COMPOSITIONS AND ELEMENTS HAVING DEEP UV RESPONSE WITH MALEIMIDE COPOLYMER

[75] Inventors: Frederick R. Hopf, Parsippany; Michael J. McFarland, Morristown; Christopher E. Osuch, Mine Hill, all of N.J.

[73] Assignee: Hoechst Celanese Corporation, Somerville, N.J.

[21] Appl. No.: 24,875

[22] Filed: Mar. 17, 1987

Related U.S. Application Data

[63] Continuation of Ser. No. 814,591, Jan. 2, 1986, abandoned, which is a continuation of Ser. No. 547,815, Nov. 1, 1983, abandoned.

[51] Int. Cl.$^4$ .......................... G03C 1/495; G03C 1/60
[52] U.S. Cl. ..................................... 430/192; 430/165; 430/189; 430/270; 430/326; 430/330
[58] Field of Search ............... 430/192, 189, 165, 270, 430/326, 330

[56] References Cited

U.S. PATENT DOCUMENTS

| | | | |
|---|---|---|---|
| 3,402,044 | 9/1968 | Steinhoff et al. | 430/192 |
| 3,964,908 | 6/1976 | Bargon et al. | 96/35.1 |
| 4,079,041 | 3/1978 | Baumann et al. | 430/270 |
| 4,093,461 | 6/1978 | Loprest et al. | 430/330 |
| 4,246,374 | 1/1981 | Kopchik | 525/329 |
| 4,266,005 | 5/1981 | Nakamura et al. | 430/271 |
| 4,415,652 | 11/1983 | Proskow | 430/326 |
| 4,426,247 | 1/1984 | Tamamura et al. | 430/313 |
| 4,524,121 | 6/1985 | Gleim et al. | 430/192 |
| 4,547,455 | 10/1985 | Hiramoto et al. | 430/197 |

OTHER PUBLICATIONS

Babb et al., *Research Disclosure*, 6/1975, pp. 51–53.
DeForest, W. S., "Photoresist Materials and Processes", McGraw-Hill Book Co., 1975, pp. 47–49 and 55–59.
Van Paessoham, G. et al., "Makromol. Chem. 78", pp. 112–120, 1964.
Elliott, D. J., "Integrated Circuit Fabrication Tech.", McGraw-Hill Book Co., pp. 234, 324 and 325, 1982.

*Primary Examiner*—Charles L. Bowers, Jr.
*Attorney, Agent, or Firm*—Plottel & Roberts

[57] ABSTRACT

Actinic (deep ultraviolet, ultraviolet and visible) light sensitive positive photoresist compositions containing a mixture of an alkali-insoluble photoactive compound capable of being transformed into an alkali-soluble species upon exposure to actinic radiation, in an amount sufficient to render the mixture relatively alkali insoluble and a polymer comprising an amount of —CO—NH—CO— groups, such as maleimide and especially maleimide-substituted styrene copolymers, sufficient to render the mixture readily alkali soluble upon exposure to actinic radiation are disclosed. The preferred copolymers include maleimide/styrene or α-methylstyrene in a 1:1 molar ratio. The preferred photoactive compound suitable for a positive photoresist composition responsive to deep UV actinic radiation has the formula 18-B in Table I. The present invention also contemplates photosensitive elements and thermally stable photochemically imaged systems based on the actinic light sensitive positive photoresist compositions. The positive photoresist compositions are coated onto a substrate to produce a photosensitive element, which upon exposure to a pattern of actinic radiation of wavelength in the range of about 200–700 nm produces a photochemically imaged system that can be treated with an alkaline developer to form highly resolved patterns, by highly selective removal of exposed areas. After development, preferred embodiments of the photochemically images systems exhibit insignificant changes in the highly resolved features (one micron) in the patterned image upon postbaking at temperatures of about 230° C. and is, thereafter readily stripped. The high thermal stability exhibited by the photochemically imaged systems formed from the positive photoresist compositions of the present invention allows faster processing at higher temperatures, on equipment like plasma etchers and ion implanters; the developed photochemically imaged systems of the present invention retain high resolution, i.e., retain sharp, steep patterned image profiles.

13 Claims, 2 Drawing Sheets

230°C–30 min.

Unbaked

Electron Micrographs Showing Thermal Stability

POSITIVE PHOTORESIST THERMALLY STABLE COMPOSITIONS AND ELEMENTS HAVING DEEP UV RESPONSE WITH MALEIMIDE COPOLYMER

This application is a continuation of application Ser. No. 814,591, filed Jan. 2, 1986, abandoned which is a continuation of application Ser. No. 547,815 filed Nov. 1, 1983, abandoned.

BACKGROUND OF THE INVENTION

This invention generally relates to actinic (deep ultraviolet, ultraviolet and visible) light sensitive positive photoresist compositions containing a mixture of an alkali-insoluble photoactive compound capable of being transformed into an alkali-soluble species upon exposure to actinic radiation, in an amount sufficient to render the mixture relatively alkali insoluble and a polymer comprising an amount of $-CO-NH-CO-$ groups, such as maleimide and especially maleimide - substituted styrene copolymers, sufficient to render the mixture readily alkali soluble upon exposure to actinic radiation. The invention also relates to photosensitive elements and thermally stable photochemically imaged systems based on the actinic light sensitive positive photoresist compositions.

Positive and negative photoresists are utilized in the fabrication of optical lithographic systems such as lithographic plates and semiconductor devices including integrated circuits. Generally, a photosensitive element is produced by depositing a photosensitive material on a substrate e.g., silicon or aluminum. A photochemically imaged system is produced by image-wise exposure of the photosensitive deposit or portions thereof through a patterned mask to actinic radiation to produce a latent image; the exposed deposit is treated with a suitable developer solution to form a patterned image. Whereas the exposed areas of negative photoresists are insoluble in developer, the exposed areas of positive photoresists are soluble in the developer leading to formation of a patterned image by removal of the exposed areas.

The utility of a positive photoresist composition is determined by a number of important properties. One of these properties is the inverse sensitivity which is defined herein as the actinic exposure, in terms of energy per unit area, i.e., $mJ/cm^2$ for example, at specified wavelength or wavelengths required to completely remove film in exposed areas under specified development conditions. Other factors being the same, it is generally desirable to achieve the lowest possible inverse sensitivity since the required exposure time for a given illumination intensity (in $mJ/cm^2$, for example) is directly proportional to inverse sensitivity and since it is usually desirable to minimize process time. Another important property of a positive resist is film loss or percent thinning which, for a given thickness, is the percent of initial film thickness which is lost in the unirradiated areas under specified exposure and development conditions. It is usually desirable that this quantity be as small as possible, other factors being the same. Typical values practiced in the electronics industry are 5-10 percent for a one micron film. A third property is contrast which relates to the ability of the resist to distinguish between different light levels. For a positive resist, contrast is defined for a set of development conditions by $[\log_{10}(E_o/E_s)]^{-1}$ where $E_o$ is the inverse sensitivity and where $E_s$ is the exposure obtained by linear extrapolation of a plot of film thickness versus exposure from $E_o$ to full film thickness (see FIG. 1). It is usually desirable to obtain a high contrast. Typical commercial positive photoresists employed by the electronics industry which employ novolak resins give contrast values between 1.5 and 3.5 depending on development conditions. Higher contrast values have been reported for some positive photoresists based on acrylic acid containing polymers, but a complicated two-step development process is required. Although inverse sensitivity, contrast and film loss describe to first approximation the lithographic performance of a positive photoresist for a given type of exposure and given development conditions, several other properties are also important. The positive photoresist should demonstrate high quality images as demonstrated by, say, the ability to reproduce accurately and cleanly one or two micron lines and spaces in a one micron thick film. Image quality may be examined visually using optical or electron microscopy.

Since practical applications often involve subsequent processing steps at elevated temperatures, such as plasma etching, it is highly desirable that the thermal stability of the positive photoresist be sufficiently high so that the resulting relief image maintain its integrity at temperatures in the range 200°-250° C. A commercial product from Eastman Kodak (Micro Positive Resist 820) reportedly will withstand temperatures up to 150° C. while resists from Shipley (Microposit 23) and McDermid (Ultramac) reportedly will withstand temperatures to 200° C. (see Semiconductor International, April 1983, page 85-87). Hiraoka and Pacansky [J. Electrochem. Soc. 128, 2645 (1981)] have disclosed a method whereby traditional positive novolak-based resists may be flood exposed with approximately 1 $J/cm^2$ of deep ultraviolet radiation to provide for improved thermal stability. Although good thermal stability was observed at 155° C., the figures appear to show measurable flow at 210° C. The procedure disclosed by Hiraoka and Pacansky requires an expensive additional processing step and results in a cross-linked relief image which is difficult to strip. Thus, while thermal stability is widely recognized as an important feature for positive photoresist compositions, there is still need for a positive photoresist composition which provides thermally stable relief images at temperatures in excess of 200° C. It is also important that the positive photoresist be readily stripped following development and baking at temperatures in the range 200°-250° C.

It is recognized that many other characteristics of the positive photoresists may be important, depending upon the proposed application. Exemplary characteristics include good adherence to a substrate, ability to form uniform, striation-free films thereon by some process such as spin-casting, and resistance to acid etch conditions.

Typically positive photoresist compositions contain an alkali-soluble polymer such as a copolymer of formaldehyde and phenol (so called novolak) or an acrylic acid copolymer in combination with relatively large amounts, e.g., 35 weight percent of an alkali-insoluble photoactive compound such as a substituted naphthoquinone diazide which serves as an alkali-dissolution inhibitor in the positive resist composition. "Alkali solubility" as used herein will be defined in relative terms, which is to say that a highly alkali-soluble material would exhibit a dissolution rate which would result in removal of a given thickness, typically 1 micron thick film in a given amount of contact time (typically 60 seconds) at a given alkali strength. Likewise relatively alkali-insoluble material would exhibit removal of less than one half the same thickness in a similar amount of contact time at the same alkali strength. Photolysis of the positive photoresist composition is thought to cause rearrangement of the naphthoquinone diazide compounds via a ketene-containing material to indene carboxylic acid derivatives. Developing the photochemically imaged system in aqueous alkali removes the acidic phenolic resin and indene carboxylic acid, while the relatively non-polar or hydrophobic, unphotolyzed naphthoquinone diazide compounds retard or inhibit dissolution of the unexposed areas. See for example, U.S. Pat. No. 4,377,631 (M. A. Toukhy et al.) which discloses use of positive cresol-formaldehyde novolak resins with selected naphthoquinone diazide sensitizing compound. However, the novolak resins although quite useful, have some shortcomings, namely strong absorption of light in the so-called deep ultraviolet (DUV) spectral region (250-300 nm), and poor resistance of formed relief images to thermal degradation at temperatures above 120°-150° C.

The ultimate resolution achievable in any optical lithographic system is fundamentally limited by the wavelength of actinic radiation employed. By the term "actinic radiation" as used herein is meant electromagnetic radiation capable of causing photochemically-induced transformation. Conventional lithography utilizes actinic radiation in the ultraviolet region of the spectrum (defined herein as 300-400 nm) or in the near visible region (defined herein as 400-450 nm). Higher resolution can be achieved through use of deep ultraviolet (DUV) actinic radiation (defined herein as 250-300 nm). However, conventional, phenolic resists such as novolak resins are highly absorbing (nontransparent) in this portion of the ultraviolet region of the electromagnetic energy spectrum, and thus a flux of incident ultraviolet light sufficient for exposure is essentially prevented from reaching the lower portion of the layer of the phenolic material coated on a substrate such as a silicon wafer. For this reason, no gain in resolution upon DUV exposure, with ultraviolet radiation of wavelengths less than 300 nm, through the thickness of the phenolic material for such conventional photosensitive elements is attainable. Accordingly, such conventional positive photoresists can not form usable relief images after exposure to DUV actinic radiation.

Some DUV resists employing resins with free carboxylic acid groups are known. Thus, UK Patent Application GB No. 2,099,168 discloses a photosensitive body comprising a substrate and a photosensitive material, wherein said photosensitive material comprises an alkali-soluble polymer such as poly(methyl methacrylate-co-methacrylic acid), and an alkali-insoluble material such as a carboxylic acid ester of nitrobenzyl alcohol which upon exposure to actinic radiation becomes soluble in an alkali composition so that exposed portions of said photosensitive material dissolve in an alkali composition at a rate faster than unexposed portions of the photosensitive material and a relief image is formed.

B. E. Babb et al. (Research Disclosure, June 1975, pp. 51-53) disclose that light-sensitive triorganophosphine aromatic azide complexes in combination with binder compositions such as poly(styrene-co-maleimide) are useful in visible photographic processes and require only the steps of image-wise exposure and overall heating to 150° C. for up to 5 seconds to form and stabilize the image. However, the binder merely provides physical support for the colored photochemical image species produced by transformation of the azide upon exposure to actinic radiation. There is no recognition by Babb et al. that any chemical advantage may be taken of the alkali-soluble acidic groups in the polystyrene-co-maleimide binder. In fact, the two other binders disclosed as equivalent to poly(styrene-comaleimide), namely poly(4-vinylpyridine) and cellulose acetate butyrate do not contain any acidic groups.

There is thus a need for a positive photoresist composition exhibiting low inverse sensitivity in the deep ultraviolet region of the energy spectrum, high contrast, high resolution, low film loss and the capability of forming relief images of high thermal stability.

SUMMARY OF THE INVENTION

It has now been found that by use of a polymer composition containing the (—CO—NH—CO—) moiety and in particular a maleimide composition comprising a copolymer of at least one of the monomers, e.g., methyl methacrylate, methacrylonitrile, styrene, 4-($C_1$-$C_5$ alkyl)styrene, α-methylstryene or 2,4-di($C_1$-$C_5$ alkyl)styrene, styrene and maleimide and optionally containing an effective amount of N-($C_1$-$C_5$ alkyl)maleimide, it is possible to prepare positive photoresist compositions suitable for coating onto a substrate to produce a photosensitive element, which upon exposure to a pattern of actinic radiation of wavelength in the range of about 200-700 nm produces a photochemically imaged system that can be treated with an alkaline developer to form highly resolved patterns, by highly selective removal of the coating from exposed areas. After development, preferred embodiments of the photochemically imaged systems exhibit insignificant changes in the highly resolved features (one micron) in the patterned image upon post-baking at temperatures of about 230° C. (see FIG. 2) and is, thereafter readily stripped. The high thermal stability exhibited by the photochemically imaged systems formed from the positive photoresist compositions of the present invention allows faster processing at higher temperatures than previously employed with prior art organic resist polymers, on equipment like plasma etchers and ion implanters; the developed photochemically imaged systems of the present invention retain high resolution, i.e., retain sharp, steep patterned image profiles.

Thus, in accordance with the present invention, there is provided a composition comprising a copolymer of 4-($C_1$-$C_5$ alkyl)styrene or 2,4-di($C_1$-$C_5$ alkyl)styrene and maleimide and optionally an effective amount of N-($C_1$-$C_5$ alkyl)maleimide.

In another aspect of the present invention, there is provided an alkali soluble composition comprising a copolymer formed by polymerization of at least about 10 mole % of maleimide and the balance being N-($C_1$-$C_5$ alkyl)maleimide and styrene, α-methylstyrene or 4-($C_1$-$C_5$ alkyl)styrene or 2,4-di($C_1$-$C_5$ alkyl)styrene.

In still another aspect of the present invention, there is also provided an alkali-insoluble positive photoresist composition comprising a mixture of (a) an alkali-insoluble photoactive compound, capable of being transformed into an alkali-soluble species upon exposure to actinic radiation, in an amount sufficient to render the mixture relatively alkali insoluble before exposure to actinic radiation and (b) a polymer comprising an amount of (CO—NH—CO) groups sufficient to render the mixture alkali-soluble upon exposure to actinic radiation.

The preferred polymer for the alkali soluble positive photoresist composition of the present invention comprises a polymer containing an effective amount of

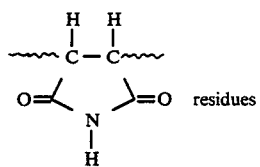 residues

In still another aspect of the present invention, there is provided a positive photoresist composition comprising a mixture of (a) about 65-99 weight percent of a copolymer prepared from

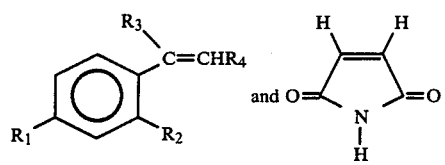

and, optionally, an effective amount of:

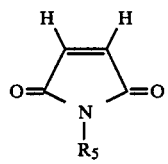

wherein $R_1$ to $R_4$ are independently H or ($C_1$-$C_5$)alkyl, and wherein $R_5$ is ($C_1$-$C_5$)alkyl; and (b) about 1-35 weight percent of a photoactive compound becoming alkali-soluble upon exposure to actinic radiation.

In a further aspect of the present invention, there is provided a photosensitive element comprising a substrate bearing a layer of a photoresist composition comprising a mixture of (a) about 65-99 percent of a copolymer prepared from of

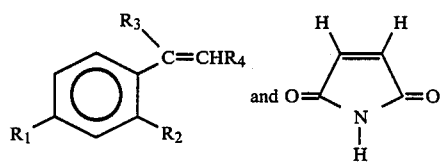

and, optionally, an effective amount of:

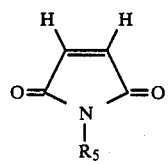

wherein $R_1$ to $R_4$ are independently H or ($C_1$-$C_5$ alkyl) and wherein $R_5$ is ($C_1$-$C_5$ alkyl); and (b) about 1-35 weight percent of a photoactive compound wherein the photoresist composition upon exposure to actinic radiation is rendered soluble in alkaline solution.

Finally, the present invention provides a photochemically imaged system comprising a substrate to which has been applied a positive photoresist coating material comprising a mixture of (a) about 65-99 weight percent of a copolymer prepared from:

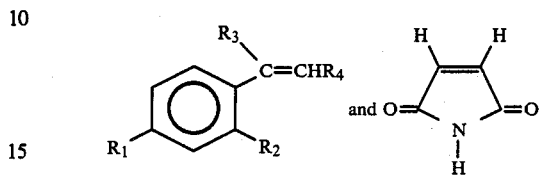

and, optionally, an effective amount of:

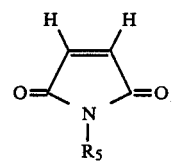

wherein $R_1$ to $R_4$ are independently H or ($C_1$-$C_5$) alkyl, and wherein $R_5$ is ($C_1$-$C_5$)alkyl; and (b) about 1 to about 35 weight percent of a photoactive compound;

wherein areas of the positive photoresist coating material having been exposed to a pattern of actinic radiation can be removed with a liquid comprising an alkaline solvent used as a developer in which the positive photoresist coating material was relatively insoluble prior to said exposure.

DETAILED DESCRIPTION OF THE PRESENT INVENTION

Figure 1:
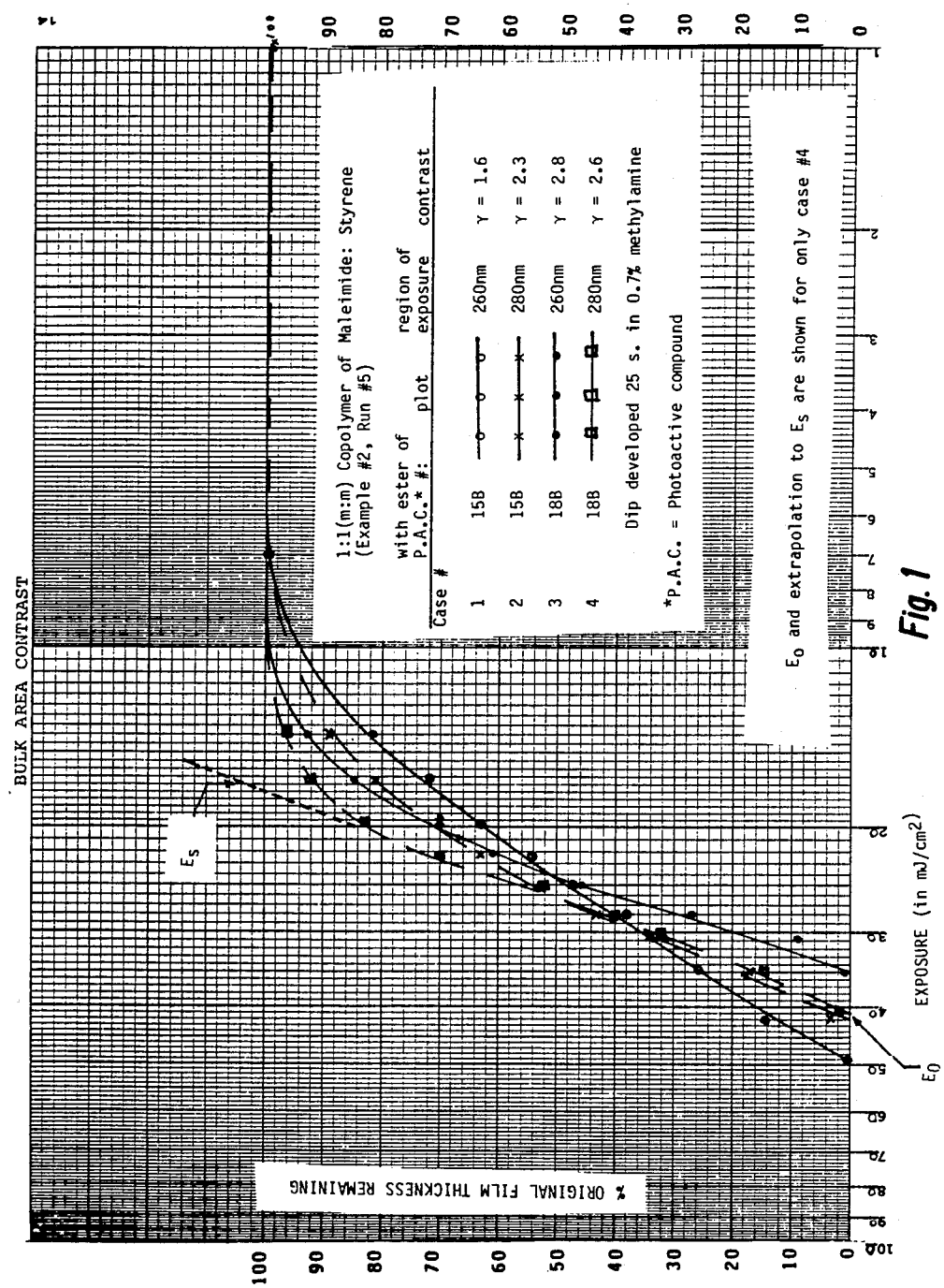
FIG. 1 graphically displays unexposed film thickness (% thinning) as a function of exposure to actinic radiation for preferred embodiments of the present invention having high contrast and high inverse sensitivity.

The present invention may be fully understood by a discussion of (I) Polymer Compositions - the homo-, co-and terpolymers containing the —CO—NH—CO— moiety; (II) Positive Photoresist Compositions which comprise a mixture of an alkali insoluble photoactive compound and a polymer comprising an amount of ✢CO—NH—CO✢ moieties sufficient to render the mixture alkali-soluble upon exposure to actinic radiation; (III) The Photosensitive Element comprising a substrate bearing a layer of the Positive Photoresist Composition; (IV) The Photochemically Imaged Systems which comprise a Photosensitive Element having a latent image; and (V) Process for Developing the latent image to produce a Patterned Relief Image.

I. Polymer Compositions and Methods of Making Same

The polymer compositions useful for the present invention comprise homopolymers, copolymers and terpolymers, each containing residues having the imide group, ─CO─NH─CO─, in an amount sufficient to render the polymer soluble in an alkali solution.

The (─CO─NH─CO─) moiety may be contained within a heterocyclic ring structure which is incorporated directly into a homo-, co- or terpolymeric backbone, or may be attached to an appropriately substituted vinyl group which is incorporated into the homo-, co-or terpolymer chain.

There are various methods for obtaining a polymer containing the imide group. Pendant imide groups may be attached to a preformed polymer through chemical reactions. Exemplary reactions include:

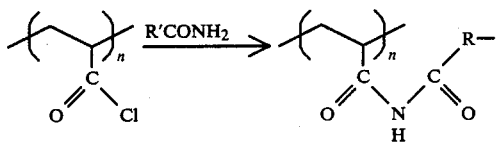

wherein R' is $C_1-C_5$ alkyl and,

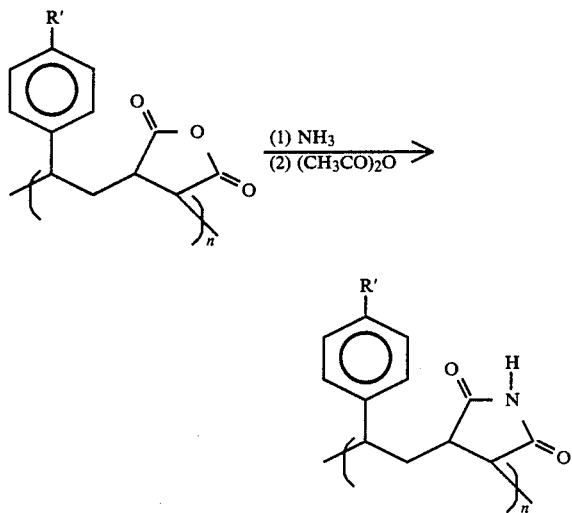

Alternatively, a monomer containing the imide moiety may be used to form homopolymers, copolymers or terpolymers by selection of comonomers which favorably affect the properties of the resins so formed.

A. Homopolymers

Among the homopolymers useful for the present invention are those formed from homopolymerization of the following monomers containing the (─CO─N-H─CO─) moiety, as shown in the following scheme:

Scheme I
Monomer          Homopolymer

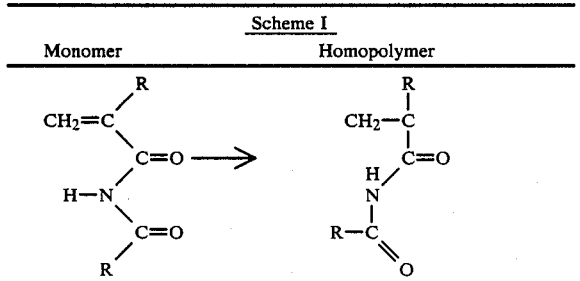

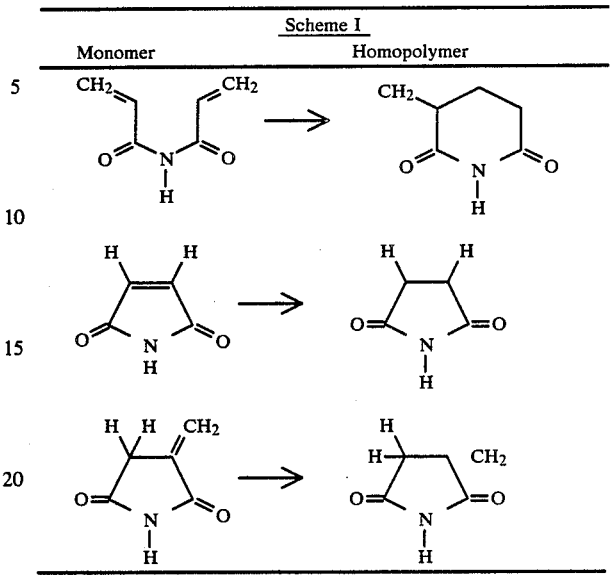

B. Copolymers: Copolymers of Two Monomers

Among the copolymers useful in the present invention are those containing at least 10 mole percent of the monomers listed in Scheme I and no more than about 90 mol percent of the N-($C_1-C_5$ alkyl) substituted derivatives of the monomers listed in Scheme I or of a film-forming monomer such as styrene, α-methylstyrene, 2-($C_1-C_5$ alkyl)styrene, 2,4-di($C_1-C_5$ alkyl)styrene or a monomer having the formula $CH_2=CR_aM$ wherein $R_a$ is H or ($C_1-C_5$ alkyl), such as $CH_3$, and wherein M is ─CN or ─$CO_2R_b$ wherein $R_b$ is ($C_1-C_5$)alkyl, especially methyl. Especially useful copolymers are those containing about 40-60 mole percent of maleimide and about 40-60 mole percent of styrene or α-methylstyrene or 2,4-dimethylstyrene, or 4-methylstyrene, or 4-ethylstyrene, or 4-isopropylstyrene or 4-tert-butylstyrene. Copolymers containing about 50 mole percent of maleimide residues and about 50 mole percent of styrene or substituted sytrene residues, such as styrene, 4-methylstyrene or α-methylstyrene are preferred.

C. Terpolymers: Copolymers of Three Monomers

Among the terpolymers useful in the present invention are those of the above-listed copolymers and at least an effective amount of N-($C_1-C_5$ alkyl) monomer containing the (─CO─N─CO─) group listed in Scheme I. By the term "effective amount of N-($C_1-C_5$ alkyl) monomer containing the (CO─N─CO) group" is meant at least some but no more than about 90 mole percent of the imido hydrogens are substituted by ($C_1-C_5$) alkyl groups in the copolymers and terpolymers useful in the present invention.

Other useful terpolymers contain about 40-60 mole percent of α-methylstyrene or 2-($C_1-C_5$ alkyl) styrene or about 10-60 mole percent of maleimide and 10-50 mole percent of N-($C_1-C_5$ alkyl) maleimide. In addition, a terpolymer formed by copolymerization of about 40-60 mole percent of styrene, about 10-60 mole percent of maleimide and about 10-40 mole percent of N-($C_1-C_5$ alkyl)maleimide is especially desirable. Another useful terpolymer is formed by copolymerization of about 50 mole percent of styrene or 2-($C_1-C_5$ alkyl)

styrene or 4-($C_1$-$C_5$ alkyl) styrene and about 25 mole percent of maleimide and about 25 mole percent of N-($C_1$-$C_5$ alkyl) maleimide such as N-methylmaleimide.

All of the above described homo-, co- and terpolymer compositions contain at least 10 mole percent of residues containing the (—CO—NH—CO—) moiety and as such are alkali-soluble, especially aqueous alkali soluble.

D. Preparation of Polymers

The homo-, co-, and terpolymers of the present invention may be produced by contacting the above-described monomers in a suitable liquid polymerization solvent in the presence of a free radical generating polymerization initiator under typical free radical vinyl polymerization conditions.

The suitable liquid polymerization solvents should be chemically inert to all reactants under the polymerization condition chosen and should serve as a solvent for reactants. Suitable solvents include N,N-dimethylformamide, cyclopentanone, cyclohexanone and lower alcohols, especially methanol.

Suitable free radical generating polymerization initiators include organic peroxy compounds such as the well-known aliphatic and aromatic peroxy compounds, including peroxidic esters or acids, and organic azonitrile compounds disclosed in U.S. Pat. No. 3,706,723 which is hereby incorporated by reference. A particularly satisfactory initiator is azobisisobutyronitrile. Typically, the initiator is present at a concentration of about 0.2 to about 2 percent of the weight of monomer(s).

Although not ordinarily preferred, polymerization may also be initiated or catalyzed by actinic radiation, as may, for example, be provided by ultraviolet light, x-rays and the like.

Polymerization temperatures and pressures are not critical. The polymerization reaction should be carried out at a temperature consistent with the initiator used, the desired reaction rate, the desired molecular weight and other factors well known to those skilled in the art of free radical vinyl polymerization. The polymerization of the monomers of the present invention are conveniently conducted at temperatures in the range of about 50°-100° C., preferably at about 60°-70° C. The polymerization may be at atmospheric pressure under a blanket of inert gas such as nitrogen or argon, but autogenous pressures may also be used.

If desired, the molecular weight of the copolymer product may be varied or controlled by inclusion in the polymerization recipe of one or more of the well-known chain transfer agents or chain transfer solvents.

The precise composition of the polymer is determined by reaction conditions (initiator, initiator concentration, solvent, temperature), by the relative monomer concentrations, and by the relative reactivities of specific monomer units. The composition can be controlled within limits using techniques known to those skilled in the art. Alkyl-substituted maleimides and alkyl-substituted styrenes form an electron poor-electron rich pair of monomers and as such are believed to form alternating copolymers (see P. O. Tawney et. al, J. Org. Chem. 26, 15 (1961)).

The average molecular weights of all of the above-described polymer compositions are normally from about $2 \times 10^6$ to about $2 \times 10^4$ (weight-average) as measured by light-scattering. Polymers having a low weight-average molecular weight of about 20 000 and simple 1:1 molar ratio of styrene residues to maleimide residues in an alternating vinyl polymer structure are more preferred. These more preferred polymer compositions are conveniently obtained by carrying out the above-described solution polymerization in the presence of a chain transfer agent such as dodecanethiol.

II. Positive Photoresist Compositions

A. Alkali Insoluble Positive Photoresist Composition

In its broadest aspect, the present invention provides an alkali-insoluble positive photoresist composition comprising a mixture of (a) an alkali-insoluble photoactive compound, capable of being transformed into an alkali-soluble species upon exposure to actinic radiation, in an amount sufficient to render the mixture relatively alkali-insoluble; and (b) a polymer comprising residues containing an amount of —CO—NH—CO— groups sufficient to render the mixture alkali-soluble upon exposure to actinic radiation.

B. The Photoactive Compounds

The broadest as well as preferred positive photoresist compositions of the present invention are relatively alkali-insoluble before irradiation with actinic radiation and alkali-soluble after exposure. The copolymer compositions of the present invention used in mixture with the photoactive compound are alkali-soluble due to the presence of the —CO—NH—CO— moiety. The photoactive compound is a hydrophobic material, which, when physically mixed with the alkali-soluble polymer, protects the polymer from dissolution. Absorption of actinic radiation by the photoactive compound converts said compound into the hydrophilic state, thereby destroying this protective action and enhancing dissolution.

The photoactive compounds that may be incorporated into the positive photoresist compositions of the present invention are compounds which upon exposure to actinic radiation are transformed into compounds containing acidic groups such as carboxylic acid groups which are more soluble in aqueous alkaline developers than the photoactive compound before exposure. Suitable photoactive compounds used in positive photoresists of this kind include ortho-nitrobenzyl esters or amides of organic acids such as ortho-nitrobenzyl cholate, or cyclic diazo ketones having diazo and keto groups at adjacent positions on the molecule, such as the esters of naphthoquinone diazide sulfonic acid, especially 1,2-naphthoquinone-2-diazo-5-sulfonic acid esters having formulae listed in Tables I and II wherein X=OAr and Ar=A,B,C or D which are described in U.S. Pat. Nos. 3,046,118; 3,046,121; 3,106,465; 3,148,983; 3,201,239 and 3,666,473 which are hereby incorporated by reference. Synthesis of photoactive compounds incorporating a cyclic diazo ketone (5-diazo Meldrum's acid) having formula 21 in Table II may be prepared by modification of procedure described by B. D. Grant et al. in IEEE Transactions on Electron Devices, November 1981, Vol. ED-28, page 1300 which is hereby incorporated by reference. Illustrative of suitable photosensitive compounds are those listed in Tables I and II, including the following:

2,3-dihydroxy-4-(6-diazo-5,6-dihydro-5-oxo-1-naphthalenesulfonyloxy) benzophenone (5); 2-hydroxy-3,4-bis(6-diazo-5,6-dihydro-5-oxo-1-naphthalenesulfonyloxy) benzophenone (1); 2,3,4-tris(6-diazo-5,6-dihydro-5-oxy-1-naphthalenesulfonyloxy) benzophenone (11); 4,4'-bis(6-diazo-5,6-dihydro-5-oxo-1-naphthalenesulfonyloxy) benzophenone (12); 2-hydroxy-4-

(6-diazo-5,6-dihydro-5-oxo-1-naphthalenesulfonyloxy) benzophenone (2); 2,4-bis(6-diazo-5,6-dihydro-5-oxo-1- 5,6-dihydro-5-oxo-1-naphthalene sulfonyloxy)isopropylidenebiscyclohexane (18).

TABLE I

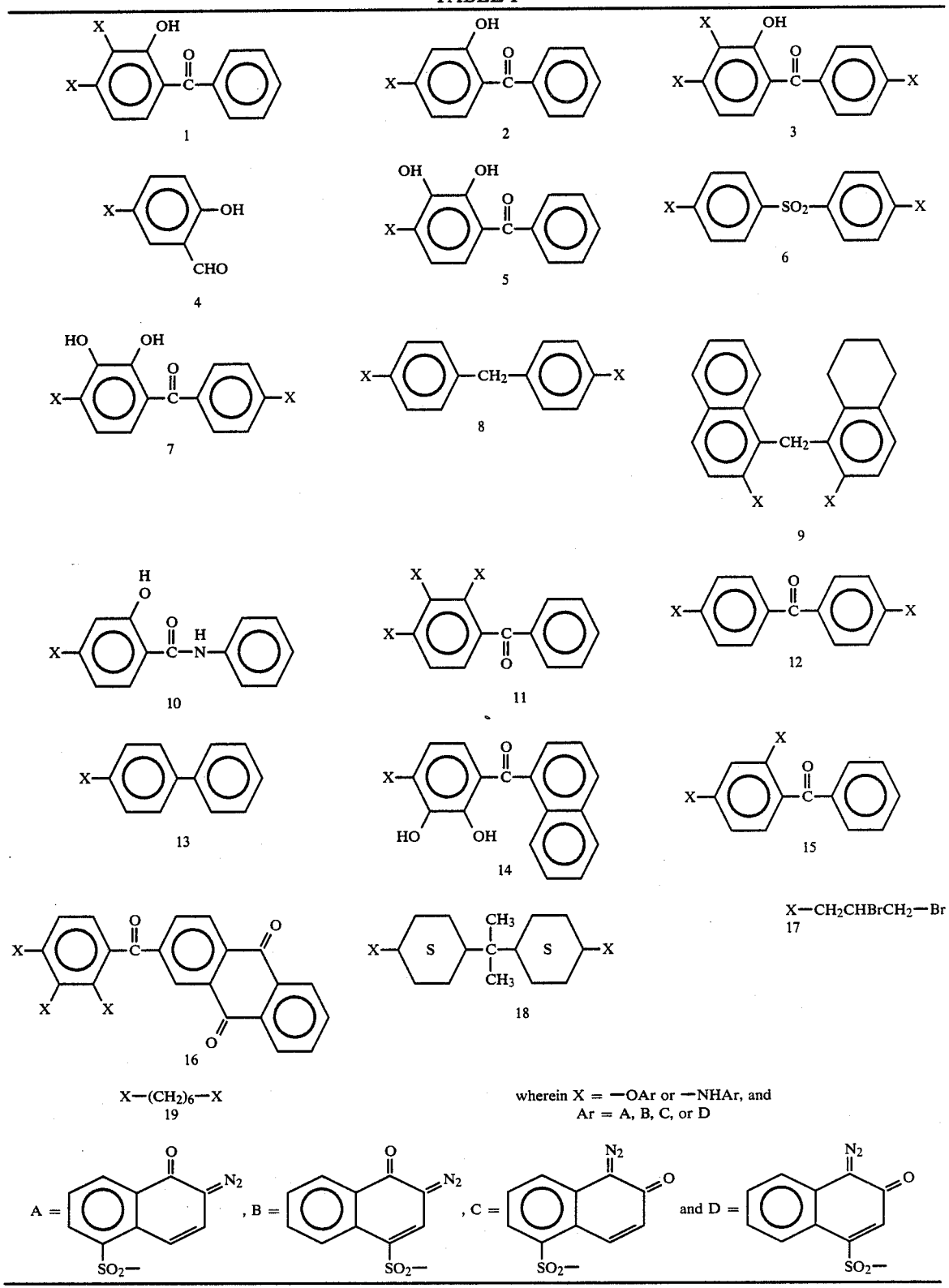

naphthalenesulfonyloxy) benzophenone (15); or 2,3-dibromo-1-(6-diazo-5,6-dihydro-5-oxo-1-naphthalenesulfonyloxy) propane (17); or 4,4'-bis(6-diazo- Also suitable are the o-nitrobenzyl esters (20) and related compounds and 5-diazo Meldrum's acid derivatives (21) illustrated in Table II.

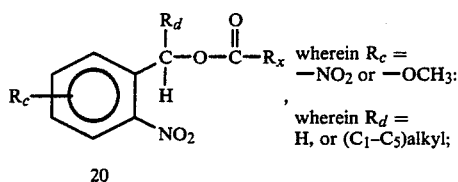

wherein $R_c$ = —$NO_2$ or —$OCH_3$;

wherein $R_d$ = H, or ($C_1$-$C_5$)alkyl;

20 and wherein $R_x$ = 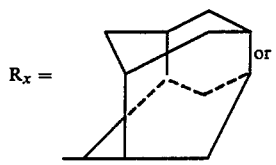 or

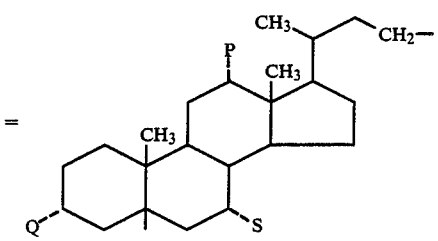

wherein P = Q = S = OH; or
P = Q = OH and S = H; or
P = Q = OH and S = OH; or
P = Q = S = H; or
P = S = H, and Q = OH.

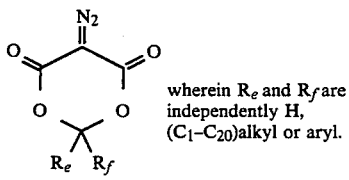

wherein $R_e$ and $R_f$ are independently H, ($C_1$-$C_{20}$)alkyl or aryl.

21

The choice of photoactive compound is governed by a number of considerations known in the art. Among those are compatibility with the polymer compositions of the present invention, solubility in solvents appropriate to the polymer compositions, thermal stability, ability to protect the polymer compositions from dissolution before irradiation as well as appropriate absorbance within the range of wavelengths of actinic radiation chosen.

Particularly useful photoactive compounds for the practice of this invention are esters of compound 15 with diazonaphthoquinone compounds A and B. See Table I. It is recognized that substituted aryl groups absorb strongly in the deep UV and that high absorption degrades resist performance by preventing actinic radiation from reaching the substrate. Thus, positive photoresist compositions suitable for deep UV exposure preferably contain photoactive compounds which have no aromatic groups in the ester side group, and as such are more transparent in the deep UV. Exemplary are structures 17, 18 and 19 of Table I. Especially preferred are esters of compound 18 with the diazonaphthoquinone compounds A and B of Table I. Since compound 18 in Table I may be prepared by reduction of the corresponding aromatic compound, other photoactive compounds useful in the deep UV may also be prepared by appropriate reduction of aromatic compounds and e.g., 11, 12 or 15 listed in Table I.

C. Polymers Comprising Residues Containing (—CO—NH—CO—) Groups

Among the polymers containing the (—CO—NH—CO—) groups useful in the alkali insoluble positive photoresist composition are homopolymers listed in Scheme I, copolymers formed by co-polymerization of the monomers containing the (—CO—NH—CO—) groups listed in Scheme I with the film-forming monomers listed above such as styrene and substituted styrenes or monomers having the formula $CH_2$=$CR_aM$ such as methyl methacrylate and methacrylonitrile as well as terpolymers formed by copolymerization of monomers listed above with the N-($C_1$-$C_5$) substituted monomers derived from monomers containing the (—CO—NH—CO—) groups listed in Scheme I.

The choice of polymer composition for the practice of this invention is dictated by a number of considerations including thermal stability, film-forming character, dissolution in alkali media, transparency in the spectral range of actinic radiation employed, resistance to acid etching media, resistance to thermal and plasma processing, lack of residue upon dissolution with alkali, controlled and reproducible solubility characteristics, and other properties recognized in the art.

Among the polymers useful in the positive photoresist composition of the present invention are homopolymers, copolymers and terpolymers containing residues having the -(-CO—NH—CO-)- such as described above in reference to the polymer compositions of the present invention. Particularly useful are homopolymers of maleimide, or copolymers of maleimide and styrenes of the structure:

Scheme II

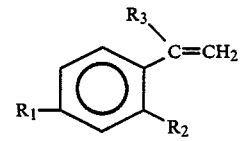

wherein $R_1$, $R_2$ and $R_3$ are independently ($C_1$-$C_5$)alkyl, e.g., methyl or H. Particularly preferred are copolymers of maleimide with styrene or α-methylstyrene. Although the ratio of co-monomers can be varied from about 10:1 to about 1:10, the optimum ratio is near 1:1. This optimum ratio may be attributed to the fact that maleimide and styrene are believed to form alternating co-polymers of reproducible structure (P. O. Tawney et al., J. Org. Chem. 26 15 (1961)).

Since the bath life of a developer system is generally longer for high alkali concentration, it may be desirable to use polymers with controlled solubility. Because of the propensity of maleimide to form alternating copolymers with electron rich monomers such as styrene, this control is most readily accomplished by incorporation of N-alkyl maleimide monomers or alkyl substituted styrene monomers.

It is a special feature of the present invention that polymers incorporated into the broadest as well as preferred positive photoresist compositions comprise residues containing an amount of -(-CO—NH—CO-)- groups sufficient to render the mixture of photoactive compound and polymer alkali soluble after exposure of the mixture to actinic radiation. While the homopolymers contain residues containing only the $+CO-NH-CO+$ moiety, the co- and terpolymers conveniently should contain at least about 10 mole percent of the unsubstituted imido groups $+CO-NH-CO+$.

Preferred copolymers have 10 mole percent of the residues containing the $+CO-NH-CO+$ groups and the balance being N-($C_1$-$C_5$) substituted imido residues formed by monomers of Scheme I or residues formed from one of the film-forming monomers of Scheme II or monomers having the formula $CH_2=CR_aM$ described herein above.

Particularly useful for polymers for the broadest and preferred positive photoresist compositions of the present invention are polymers wherein the copolymer comprises about 10 mole percent of maleimide and about 40 mole % of N-($C_1$-$C_5$ alkyl) maleimide and the balance being a styrene unit such as styrene, or alpha-methylstyrene or 2,4-dimethylstyrene or 4-methyl-, or 4-ethyl, or 4-isopropyl- or 4-tert-butylstyrene. An especially preferred polymer comprises about 50 mole percent of styrene and about 40 mole percent of maleimide and 10 mole percent of N-($C_1$-$C_5$ alkyl)maleimide. Also useful are polymers wherein the copolymer comprises about 50 mole percent maleimide and about 50 mole percent of one of the styrenes designated in Scheme II above. Particularly useful are a 1:1 maleimide/4- tert-butyl styrene copolymer or 1:1 maleimide/α-methylstyrene copolymer or 1:1 maleimide/styrene copolymer.

D. Positive Photoresist Composition

In a preferred embodiment of the present invention, there is also provided a positive photoresist composition comprising a mixture of (a) about 65-99 weight percent of a copolymer of styrene,α-methylstyrene or 2- or 4- ($C_1$-$C_5$ alkyl)styrene or 2,4-di($C_1$-$C_5$ alkyl)styrene and maleimide and, optionally, an effective amount of N-($C_1$-$C_5$ alkyl) maleimide wherein $C_1$-$C_5$ alkyl is independently methyl, ethyl, isopropyl or tert-butyl and (b) about 1-35 weight percent of a photoactive compound capable of becoming alkali-soluble upon exposure to actinic radiation.

The preferred positive photoresist composition of the present invention contains a photoactive compound described above and a copolymer wherein said styrene residues and said maleimide residues are in the molar ratio of about 1:1.

Because of the wide range of alkali-soluble polymers, suitable photoactive compounds, and developer that are possible, the exact ratio of photosolutions active compound to alkali soluble polymers in the final positive photoresist composition should be determined by a controlled sample. Considerations will include dissolution rate of unexposed resist which will determine film loss in a reasonable development time (preferably 20-40 sec), dissolution rate of fully irradiated resist, which must provide for full clearance of preferably a 1 micron film in a reasonable development time, the absorption and bleaching characteristics of the photoactive compound, and the spectral characteristics of the illumination source employed. For the preferred polymer system, a maleimide-styrene copolymer in combination with the preferred photoactive compounds, such as esters of compounds 15 A or B and 17 A or B and 18 A or B (Table I) and 20, especially where in P=Q=OH and S=OH or H in $R_x$, in Table II and for the preferred developer systems, such as methylamine or KOH at pH near 12, the amount of photoactive compound in the mixture should be about 8-25 weight percent, preferably about 10-15 weight percent.

III. The Photosensitive Elements

The present invention also provides a photosensitive element such as a semiconductor wafer comprising a substrate bearing a layer of a photoresist composition comprising a mixture of about 65-99 weight percent of one of the homopolymers or copolymers or terpolymers of the present invention, e.g., styrene, α-methylstyrene or 2,4-di($C_1$-$C_5$ alkyl)styrene and maleimide and, optionally an effective amount of N-($C_1$-$C_5$ alkyl)maleimide, and about 1-35 weight percent of a photoactive compound wherein the photoresist composition upon exposure to actinic radiation is rendered soluble in alkaline solution.

In use, the physical mixture of polymer and photoactive compound is coated on a substrate such as silicon wafers, which may have a coating such as $SiO_2$ or Al, or chrome-plated glass, by techniques such as spinning a solution of the mixture in an appropriate organic solvent to form a photosensitive element. The substrates useful to integrated circuits are generally silicon wafers which may have a thin oxide, e.g., silicon oxide coating or other coatings such as a silicon nitride or aluminum thereon. The process of spin-coating is well known and is described in detail by L. F. Thompson et al. in "Introduction to Microlithography" (ACS Symposium Series, No. 219 Amer. Chem. Soc., 1983, at pages 161-214).

The coating compositions useful in preparation of the photosensitive element of the present invention are typically formed by dissolving or even dispersing the physical mixture of polymer and photoactive compound in a suitable organic solvent or combination of organic solvents used in the art to prepare polymer coatings. Suitable organic solvents should (1) be able to wet the substrate and (2) dissolve but not react with the polymers and photoactive compounds, and (3) have an evaporation rate appropriate for the method, e.g., spin-coating, used to deposit the positive photoresist composition onto the substrate. Exemplary organic solvents include cyclohexanone, cyclopentanone, cellosolve acetate, dimethylsulfoxide, N,N-dimethylformamide, dimethoxyethyl ether, and mixtures of these solvents with each other or with one or more of the lower alkanols, e.g., methanol or hexanol. For the preferred homopolymers containing the $+CO-NH-CO+$ groups or copolymers and terpolymers containing styrene and maleimide residues, N,N-dimethylformamide is the preferred solvent.

The concentration of the coating solutions or dispersions is dependent upon the particular copolymer and photoactive material employed as well as the solvent, the support and the coating method employed. For spin-coating the concentration is usually chosen so as to give an appropriate film thickness (typically about 1 micron) at a convenient spinning speed (typically about 5000 rpm). Typically useful coatings are obtained with coating solutions containing about 10 to about 25% by weight of the physical mixture. Other components which can be advantageously included in the coating compositions are materials which serve to improve film formation, coating properties, adhesion of the coatings to the substrate, mechanical strength, contrast, and inverse sensitivity. These components are well known in the art and need not be further discussed.

IV. The Photochemically Imaged Systems

The present invention further provides a photochemically imaged system such as a photolithographic printing plate or an intermediate in semiconductor manufacture which comprises a substrate to which has been applied a positive photoresist coating material comprising a mixture of (a) about 65–99 weight percent of one of the homopolymers or, copolymers or terpolymers of the present invention, e.g., a copolymer of sytrene or $\alpha$-methylstyrene or 2,4-di($C_1$–$C_5$ alkyl)styrene and maleimide and optionally, an effective amount of N-($C_1$–$C_5$ alkyl)-maleimide and (b) about 1 to about 35 weight percent of a photoactive compound. The areas of the positive photoresist coating material that have been exposed to a pattern of actinic radiation can be removed with liquid comprising an alkaline solvent used as a developer in which the positive photoresist coating material was relatively insoluble prior to said exposure. The preferred copolymers comprise styrene or $\alpha$-methylstyrene or 4-tert-butylstyrene and at least about 10 mole % of maleimide, the remainder being N-($C_1$–$C_5$ alkyl)maleimide. More preferred are copolymers comprising about 50 mole percent each of maleimide and styrene residues.

The photosensitive element is exposed, to a pattern of actinic radiation in the range of about 200–700 nm, preferably in the deep UV region (250–300 nm) or UV region (300–400 nm) or near visible region (400–450 nm) to produce a photochemically imaged system. The absorption in a given wavelength range may be adjusted by varying the structure and concentration of the photoactive compounds which act as alkali solution inhibitors, and, in fact, the use of photoactive compounds absorbing in a portion of the near visible as well as the deep ultraviolet range of about 250 to 300 nm is also within the scope of the present invention. The photochemically imaged system is then developed by treatment with an aqueous alkaline solution such as aqueous solutions of sodium silicate, potassium hydroxide, tetraalkylammonium hydroxides such as tetramethylammonium hydroxide, ammonium hydroxide or even aqueous lower alkylamines such as methylamine at an appropriate pH.

V. Process for Development of the Latent Image to Produce a Patterned Relief Image In use, the photosensitive elements and photochemically imaged systems are prepared by (a) depositing on a face of a substrate such as a silicon wafer by conventional techniques, e.g., spinning a solution of the positive photoresist composition of the present invention in an amount sufficient to produce a uniform deposit having a thickness on the order of about 0.1 micron to about 20 microns, preferably about 1 micron on a face of the substrate; (b) optionally, treating said deposit under conditions of temperature and pressure sufficient to remove substantially all the suitable organic solvent; (c) image wise exposing through a mask said film to actinic radiation in the range of 200–700 nm, especially 250–300 nm, for a time sufficient to render the exposed areas of the film soluble in alkaline solution; and (d) contacting the exposed film with a developer solution comprising an alkaline material having a pH greater than about 10 for a time sufficient to remove the exposed areas of the film.

In the preferred embodiment of the above-described method, the treating step is performed, normally at a temperature of about 70°–110° C., and preferably about 90° C., for about 30 to 60 minutes, preferably for 30 to 40 minutes in a standard convection oven. Optionally, organic solvents may be removed by exposure to an infrared lamp or by baking on a hot plate.

The developer used depends on the actinic radiation exposure time (inverse sensitivity) and positive photoresist composition used. Generally, it is desirable to use a developer having a pH greater than about 10 e.g., normally about 12 that is sufficient to dissolve only the exposed areas of the film. Acceptable losses of unexposed film (% thinning) should preferably not exceed 10% and, more preferably be less than 3–5%. The particular developer and pH of same are easily determined by using a controlled sample. Exemplary of the useful developers for the 6:1(w/w) admixtures of a 1:1 copolymer of maleimide/styrene copolymer with the preferred esters of naphthoquinone diazide sulfonic acid are about 0.05–0.06 weight % KOH, about 0.10 weight % tetramethyl ammonium hydroxide (TMAH) and about 0.5–1.0 weight % of methylamine, each having a pH of about 12. For 6:1 (w/w) admixtures of maleimide/tert-butylstyrene with the preferred esters and amides of naphthoquinone diazide sulfonic acid having numbers 3, 11, 15, 18 and 19 in Table I or 20 in Table II, especially 18 in Table I or carboxylic acid esters of 20 in Table II and most preferably 18 in Table I recited herein above, useful developers are about 0.5–0.6 weight of KOH or 0.9–1.0 weight of TMAH having a pH of about 13.

Typical development times in the range about of 0.25 to 5 minutes are employed. It is generally desirable to utilize a treatment time that is not substantially longer than the minimum time necessary to dissolve the exposed region of the photosensitive body. After the pattern is formed in the photosensitive material the substrate, e.g., the wafer, is further processed through conventional steps, such as postbaking etching, and metallization to form the desired devices.

Figure 2B:
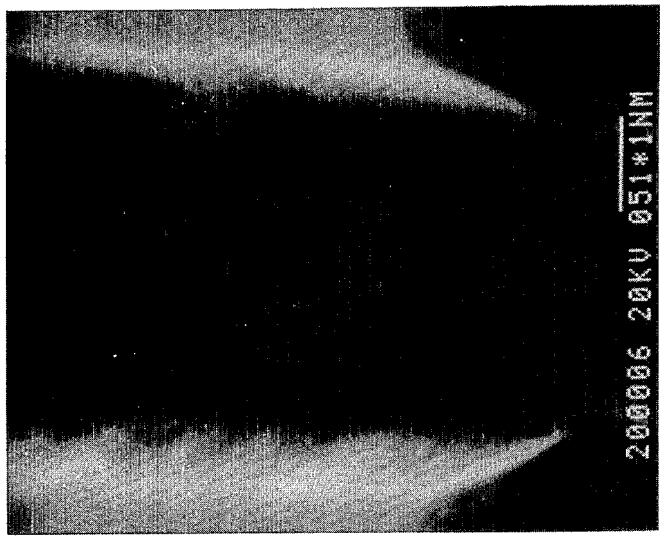
FIG. 2 pictorially illustrates insignificant changes in image profile upon postbake at 230° C. for 30 minutes of a preferred embodiment of the present invention.
Figure 2A:
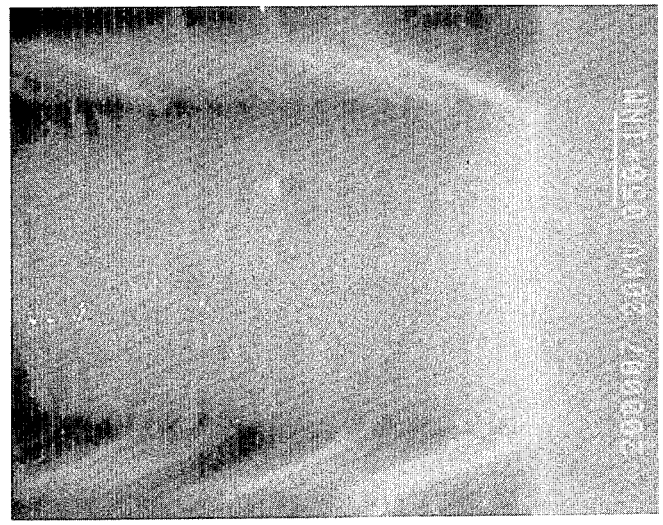

It is a special feature of the present invention that the positive photoresist compositions, that form the photochemically imaged systems, are thermally stable. Thus, the photochemically imaged systems may be postbaked or, i.e., heated at temperatures of at least about 200° C., normally about 250° C. without loss of high resolution in the imaged pattern. As illustrated in FIG. 2, small features, in a preferred, imaged positive photoresist composition of a 6:1 (w/w) admixture of the maleimide/styrene copolymer (1:1 molar ratio) with a preferred photoactive compound such as compound 15 A or B or 18 A or B (Table I) or 20 (o-nitrobenzylcholate) in Table II examined by electron microscopy, show insignificant dimensional change upon postbaking at 230° C. for 30 minutes. Following the postbake, the imaged positive photoresist was readily stripped using a standard photoresist stripper, particularly organic solvents such as N,N-dimethylformamide.

FIG. 1 shows remaining film thickness as a function of exposure for two preferred photochemically imaged systems derived from a 6:1 (w/w) mixture of 1:1 (molar ratio) maleimide-styrene copolymer of Run #5 of Example 2 with the preferred photoactive compound corresponding to esters of the compounds 15B and 18B in Table I and developed by dipping for 25 seconds in 0.7 weight percent aqueous methylamine. The two preferred photochemically imaged systems used in FIG. 1 were prepared in a manner analogous to the procedure of Example 16, Run #18. It is clear that inverse sensitivities for zero film thickness of about 40 mJ/cm$^2$ for irradiation at 280 nm can be obtained with unexposed film thickness of about 98% of original thickness. The contrast, defined as [log $_{10}$ (E$_o$/E$_s$)]$^{-1}$, where E$_o$ and E$_s$ are designated in FIG. 1, is approximately 2.6. Typical phenolic novolak resins show sensitivities in excess of 500 mJ/cm$^2$ at the same wavelengths and also show poor contrast. High resolution images are readily obtained with positive photoresist systems of the present invention.

GENERAL EXPERIMENTAL

NMR spectra of polymers were obtained with a Varian XL-200 instrument using perdeutero-tetrahydrofuran (THFd$_8$) as a solvent. Melting points were obtained with a Thermolyne melting point apparatus. Thermogravimetric analysis (TGA) was accomplished on a Dupont Instruments Model No. 951 instrument at a heating rate of 10° C. per minute under an argon atmosphere. Differential Scanning Calorimetry (DSC) was carried out with a Dupont Instruments Model No. 990 instrument at a heating rate of 20° C. per minute.

Relative viscosities were obtained with an Ubbelohde viscometer using standard techniques (see M. P. Stevens, *Polymer Chemistry, An Introduction*, Addison Wesley, 1975).

EXAMPLE 1

Preparation of Polymaleimide

A clean dry tube was charged with 4 g of maleimide (obtained from Eastman Kodak) 42 mg of azobisisobutyronitrile (AIBN) (from Eastman Kodak) and 32 mL of N,N-dimethylformamide (DMF). The homogeneous reaction mixture so formed was deoxygenated with argon for 10 min. The tube containing the reaction mixture was sealed and heated at 90° C. in an oven for 8 h. At the end of this time, the polymer was recovered by pouring the cooled reaction mixture into methanol, filtering, washing with methanol, and air drying at 60° C. The resulting polymer had a melting point greater than 300° C. and was soluble in aqueous alkaline solutions of pH=9.0 or higher. The $^1$H NMR spectrum was consistent with the succinimide structure proposed by P. O. Tawney et al., J. Org Chem., (1961) 26, 15.

EXAMPLE 2

Preparation of Malemide-Styrene Copolymer

Maleimide-styrene copolymer was prepared by copolymerizing, in a sealed tube and in the absence of air, 4.00 g of maleimide (obtained from Eastman Kodak) with 4.29 g of styrene (obtained from Fischer Scientific) dissolved in a suitable solvent. Azobisisobutyronitrile (42 mg) was used as the initiator. The tube containing the reaction mixture was deoxygenated with argon for 10 mins. The tube was sealed and heated in an oven, in a solvent, for a reaction time, and at the temperature as shown in Table III to obtain copolymers of different molecular weights. In Runs #3 and 5, 0.27 g of dodecanethiol, a chain transfer agent, was added to the reaction mixture before heating to lower the molecular weight.

TABLE III

| Run # | Solvent (Vol, mL) | Time (hr) | Temp. (°C.) | Yield (%) | $\eta$rel[1] |
|---|---|---|---|---|---|
| 1[a] | DMF (32 mL) | 2 | 90 | 76 | 1.30 |
| 2[b] | MeOH (40 mL) | 1.5 | 60 | 90 | 2.40 |
| 3[c,d] | " | 2.5 | 60 | 95 | 1.45 |
| 4[e] | C$_6$one[f] (40 mL) | 4.5 | 60 | 97 | 1.64 |
| 5[c,g] | " | 6.0 | 60 | 64 | 1.20 |

Footnotes
[1]Relative viscosity, measured with 0.5 g of polymer per deciliter of DMF at 25° C.
[a]A polymer of relatively low molecular weight was obtained.
[b]A polymer of relatively high molecular weight was obtained.
[c]Dodecanethiol (0.27 g) was added to the reaction mixture.
[d]A polymer of relatively low molecular weight was obtained.
[e]A polymer of relatively high molecular weight was obtained.
[f]C$_6$one is cyclohexanone.
[g]A polymer of relatively low molecular weight was obtained.

Isolation of the polymer was accomplished through precipitation by pouring the reaction mixture into 500 mL of methanol. The solid polymer was crushed, washed with methanol, and dried in vacuum. In the case of Runs#2 and 3 wherein methanol was the reaction solvent, the solid polymer was removed from the reaction tube, ground in the presence of methanol, filtered, and washed with methanol and air dried.

The isolated polymers had molecular weights as determined light scattering ranging from high (1.2×10$^6$, Run #2) to low (2.0×10$^4$, Run #5) depending on the exact conditions chosen. The polymers prepared according to this method were soluble in aqueous alkali having a pH equal 11.0. Based on analysis of the $^1$H NMR spectra of polymers in Runs #4 and 5, the molar ratio of NH to aryl groups was 1:1. A principal characteristic of these polymers was their thermal stability. For the polymer of Run #1, thermogravimetric analysis, in air or argon, showed the onset of degradation of the polymer occurred at a temperature of 380° C.; differential scanning calorimetry of the polymer of Run #1 gave a glass transition temperature of 240° C.

EXAMPLES 3–6

In accordance with the procedure and apparatus of Example 2, maleimide was co-polymerized with various alkyl substituted styrenes.

EXAMPLE 3

Preparation of 4-(2-methyl-2-propyl)styrene maleimide copolymer.

Thus, 4 g of maleimide, 6.6 g of 4-(2-methyl-2-propyl) styrene (obtained from Polysciences, Inc.), 42 mg of azobisisobutyronitrile and 40 mL of cyclohexanone were mixed and deoxygenated with argon. This solution was heated in a sealed tube at 60° C. for 4 hours. The resulting polymer was isolated by pouring the polymer solution into cold water, filtering, washing and drying under vacuum. The dried polymer (yield 95% of theoretical) had a melting point of greater than 300° C. The $^1$H NMR spectrum showed 0.7 NH groups for each aryl group. The polymer was soluble in aqueous alkaline solution of pH equal to 13 or higher. The relative viscosity, $\eta_{rel}$, was 1.15 (0.5 g of polymer per deciliter in DMF at 25° C.). As in Example 2 above, a chain transfer agent may be included to control molecular weight.

EXAMPLE 4

Preparation of 4-ethylstyrene maleimide co-polymer

Four grams of maleimide, 5.44 g of 4-ethylstyrene (purchased from Polysciences Inc.), 42 mg of AIBN, and 32 mL of DMF were deoxygenated with argon and heated in a sealed tube at 90° C. for 48 h. The polymer was recovered by pouring the reaction mixture into water, grinding, filtering and washing the precipitated polymer with methanol. The polymer was air-dried at 60° C. for 12 h. The resulting polymer had a melting point >300° C., and was soluble in aqueous solution at pH ≧11. The yield was 84% of the theoretical. The relative viscosity, $\eta_{rel}$=1.55 (0.5 g of polymer per deciliter in DMF at 25° C.

EXAMPLE 5

Preparation of 4-(2-propyl)styrene maleimide copolymer

The procedure of Example 4, was followed, except that 6.04 g of 4-(2-propyl)styrene (from Polysciences Inc.) was substituted for the 4-ethylstyrene. The polymer so prepared had a melting point >300° C. and was soluble in aqueous solution at pH ≧11. The yield was 65% of theoretical.

EXAMPLE 6

Preparation of 2,4-dimethylstyrene maleimide copolymer

The procedure of Example 4 was followed except that 5.44 g of 2,4-dimethylstyrene (from Aldrich Chemical Co.) was substituted for the 4-ethylstyrene. The polymer so prepared has a melting point >300° C., and was soluble in aqueous solution at pH ≧11. The yield was 62% of theoretical. The relative viscosity, $\eta_{rel}$, was 1.29 (0.5 g of polymer per deciliter in DMF at 25° C.).

EXAMPLE 7

Preparation of maleimide 4-methylstyrene copolymer

The procedure of Example 4 was followed, except that 4.88 g of 4-methylstyrene (Aldrich Chemical) was substituted for 4-ethylstyrene. The reaction mixture was heated at 90° C. for 15 hr. The white polymer (66% of theoretical) had a relative viscosity, $\eta_{rel}$=1.26 (0.5 g of polymer per deciliter in DMF at 25° C).

EXAMPLE 8

Preparation of a 1:1:1 (mole ratio) terpolymer of maleimide, N-methymaleimide, and styrene A clean tube was charged with 0.55 g of N-methylmaleimide (Aldrich Chemical) 0.48 g of maleimide, 0.52 g of styrene, 8 mL of DMF, and 13 g of AIBN. This solution was deoxygenated with argon, sealed and heated to 90° for 48 h. The polymer was isolated by pouring the reaction solution into 175 mL of stirred water, filtering the solid, washing with water and then methanol. Finally the polymer was air-dried overnight, and dried under vacuum for 3 h. A yield of 1.28 g was obtained, 82.4% of the theoretical yield.

EXAMPLE 9

Synthesis of maleimide/methacrylonitrile copolymers

In accordance with the procedure of Example 4, 12 g of maleimide 8.3 g of methacrylonitrile (Aldrich) 21 mL of DMF, 0.8 g of AIBN and 0.1 g of dodecanethiol were charged to a reaction vessel. The reaction mixture was heated for 15 hours at 90° C. The resultant solution was treated in accordance with procedure of Example 4. The final product (yield, 46% of theory) was dried in vacuum, overnight. The relative viscosity of the polymer, $\eta_{rel}$, was 1.07 (0.5 g of polymer per deciliter in dimethylformamide at 25° C.).

EXAMPLE 10

Synthesis of maleimide/methylmethacrylate copolymer

In a manner identical to Example 4, 10 g of maleimide, 10 g of methyl methacrylate, 0.8 g of AIBN, and 0.1 g of dodecanethiol were reacted in 20 g of DMF at 90° C. for 14 hr. to give 10.9 g of polymer (yield, 55% of theory). The relative viscosity, $\eta_{rel}$, was 1.10 (0.5 g of polymer per deciliter in dimethylformamide at 25° C.).

EXAMPLE 11

Preparation of 4,4'-bis(6-diazo-5,6-dihydro-5-oxo-1-naphthalenesulfonyloxy)isopropylidenebiscyclohexane The above compound was prepared by dissolving 9.6 parts of 4,4'-isopropylidenebiscyclohexanol in 95 parts by volume of pyridine. The resulting solution was cooled to 10° C. 21.4 parts of naphthoquinone-(1,2)-diazide-(2)-5-sulfonic acid chloride were dissolved in 105 parts by volume of pyridine. This solution was slowly dropped into the solution of alcohol which was vigorously stirred and maintained at 10° C. The resulting solution was stirred for 3 hours at 10°-15° C., then allowed to stand below 15° C. for at least 16 hours.

The reaction mixture was then poured slowly in a thin stream into a well-stirred container of 1700 parts by volume of ice water. The finely divided precipitate was collected by vacuum filtration, repeatedly washed with cold water and dried under vacuum. A yield of 24.8 parts of dry solid product (compound 18A of Table I) was obtained. The product was recrystallized from acetonitrile.

EXAMPLE 12

Preparation of a terpolymer of styrene, maleimide, and N-methylmaleimide

Eight-tenths of a gram of maleimide, 0.23 g of N-methylmaleimide (Aldrich), 1.07 g of styrene, 21 mg of AIBN and 8 mL of DMF were mixed, deoxygenated with argon for 20 minutes, and heated in a sealed tube to 90° C. for 14 h. After this time the polymer was isolated by pouring the reaction mixture into ice water, filtering, washing the precipitate with methanol and drying the white powder under vacuum (<0.1 mm Hg). The yield was 90% of the theoretical. The resulting polymer was soluble in aqueous solution at pH ≧12.5. The relative viscosity, $\eta_{rel}$, was 1.34 (0.5 g of polymer per deciliter in DMF at 25° C.). This Example illustrates that N-substituted maleimides can be introduced into a copolymer of maleimide and styrene (Example 2) to produce a terpolymer that was soluble in aqueous alkali of higher pH compared to that of copolymer of Example 2.

EXAMPLE 13 (Runs #6-11)

Preparation of photoresist compositions

In Run #6 a brown jar was charged with 21 g of DMF, 1.00 gm of the maleimide-styrene copolymer of Run #5 of Example 2 and 1.00 g of the photoactive compound 4,4'-bis (6-diazo-5,6-dihydro-5-oxo-1-naphthalenesulfonyloxy)isopropylidenebiscyclohexane of Example 11 (compound 18 A of Table I). (The amount of the DMF solvent was chosen to produce a 1 micron thick film when the resulting solution spun onto a silicon wafer at 5000 rpm.) This mixture was stirred until dissolution was complete. The solution so formed was pressure filtered through a 0.2 micron fluorinated polyethylene filter into a clean dry brown jar. In Run #7, the procedure of Run #6 was repeated except that the photoactive compound 2,4-bis-(6-diazo-5,6-dihydro-5-oxo-1-naphthalene-sulfonyloxy)benzophenone (prepared as disclosed in U.S. Pat. No. 4,024,122 which is hereby incorporated by reference), and the 6 g of the polymer of Example 9 were used.

In Run #8, the procedure of Run #7 was followed except that 6 g of the polymer of Example 10 were used. In Run #9, to 28 g of DMF were added 1.00 g of o-nitrobenzyl cholate (prepared as described in UK Patent Appl. GB No. 2,099,168) and 6 g of the polymer from Run #1 of Example 2. The solution so formed was filtered as described in Run #6. In Run #10, the procedure of Run #7 was followed, except that 6 g of the polymer of Example 3 were added to 28 g of DMF containing 1.0 g of the photoactive compound of Run #7. In Run #11, the procedure of Run #7 was followed, except that 6 g of the terpolymer of Example 12 were added to 28 g DMF and 1 g of the photoactive compound of Run #7.

EXAMPLE 14 (Runs 12-17)

Preparation of photoresist films on a substrate

Clean 5.08 cm. (2-inch) diameter silicon wafers (wafer A) and 5.08 (2-inch) diameter silicon wafers coated with a 10,000 angstrom layer of thermal $SiO_2$ (wafer B) were dried in an oven at 135° C. for 4 hrs. Each type of wafer was removed from the oven and thereafter exposed to vapors of 1,1,1,3,3,3-hexamethyldisilazane at room temperature for 10 min. Each wafer was placed on a commercial photoresist spinner (Headway Research). Approximately 0.25-1.0 mL of the photoresist composition of Run #6 of Example 13 was placed onto the center of the silicon wafer (wafer A) with a pipette. Wafer A was spun at 5000 rpm for 45 sec. The wafers were then placed in an oven for 30-50 min. at 90° C. to remove residual solvent. The thickness of the resulting film was measured to be 1.0±0.1 micron using a Rudolph film thickness monitor (Model RR-FTM-STD-F).

Runs #13-17 were operated in a manner exactly analogous to Run #12 except the photoresist composition and spinning speed of wafer were varied as shown in Table IV.

TABLE IV

| Run # | Photoresist Composition (Run # of Example 13) | Wafer Speed (RPM) |
| --- | --- | --- |
| 12 | 6 | 5000 |
| 13 | 7 | 3600 |
| 14 | 8 | 5000 |
| 15 | 9 | 5000 |
| 16 | 10 | 2400 |
| 17 | 11 | 5000 |

In a manner exactly analogous to that reported for Runs #12-17, wafer B was coated with the photoresist compositions of Runs #6-11 of Example 13 and spun at speeds reported in Table IV. Similar results were obtained.

EXAMPLE 15

Preparation of Photosensitive Element with latent microscopic relief image

The wafers of Example 14 were removed from the oven and allowed to cool to room temperature. Each wafer was placed on a vacuum chuck (Hybrid Technology) underneath the collimating lens of a commercial photoresist exposure source (Optical Associates, Inc., series 30 Light System: 500 watt Hg-Xe lamp with reflective optics coated for maximum efficiency at 260 nm). A high resolution photoresist test mask and step tablet (Optoline I, from Ditric Optics, quartz substrate) was placed on top of the wafer and pulled into intimate contact with the wafer by vacuum. An optical filter (a narrow band interference filter available from Oriel as No. 5360, 280 nm, ±7.5 nm) was placed on top of the mask. The net light intensity ($mW/cm^2$) transmitted through the filter was measured with an Eppley calibrated thermopile. The lamp shutter was opened for a measured amount of time to obtain the desired net exposure incident upon the mask. The net exposure incident upon the mask ($mJ/cm^2$) was determined from the incident intensity and exposure time. The step tablet provided for exposure levels at the wafer varying in steps from 100% to 1% of the exposure incident upon the mask.

EXAMPLE 16 (Runs #18-23)

Development of a latent image to produce a relief image

In Run #18, the wafer prepared as described in Example 14 was coated with a photoresist deposit of Example 14, Run #12 and subsequently exposed according to the procedure of Example 15. The latent image was developed by dipping the wafer with its exposed photosensitive element into an open vessel containing 0.7 percent by weight of methylamine. Agitation of the wafer in the developer was continued for 20 s. The wafer was then removed from the developer solution and rinsed in deionized water. The remaining film thickness in unexposed regions, the contrast, and the quality of high resolution features (1 μm to 5 μm lines and spaces) were determined. In this case, the inverse sensitivity was 40 mJ $cm^{-2}$, the contrast was about 2.3, and the loss of unexposed film was 3 percent of the original thickness. By use of both optical and scanning electron microscopy, the quality of 1 μm lines and spaces was good, the lines having flat tops and sidewalls which made a 70° angle with respect to the substrate. Holes were cleared out with no scumming or bridging.

In Run #19, the wafer was coated with a photoresist deposit as described in Example 14, Run #13, and subsequently exposed according to the procedure of Example 15. The latent image was developed by dipping the wafer with its exposed photosensitive element into an open vessel containing aqueous TMAH, pH=11.4 for 90 s. The wafer was then processed as described in Run #18 above. Sensitivity was 100 mJ $cm^{-2}$, the contrast was 2, and the loss of unexposed film was 15 percent of the original thickness. The image quality was judged to be good, consistent with the high film loss. Holes were well cleared out.

In Run 20, the wafer was coated with a photoresist deposit as described in Example 14, Run #14, and subsequently exposed according to the procedure of Example 15. The latent image was developed by dipping the wafer with this exposed photosensitive element into an open vessel containing aqueous KOH, pH=11.4, for 180 s. The wafer was then processed as described in Run #18 above. The inverse sensitivity was 100 mJ $cm^{-2}$, the contrast was 2, and the loss of unexposed film was 5 percent of the original thickness. Although image quality was judged to be good, there was a thin scum visible at the bottom of holes. This scum was avoided by developing for 30 s in aqueous KOH at a pH of 11.5, but film loss was then 15 percent of the original thickness.

In Run 21, the wafer was coated with a photoresist deposit as described in Run #15 of Example 14 and subsequently exposed according to the procedure of Example 15. The latent image was developed by dipping the wafer with its exposed photosensitive element into an open vessel containing aqueous KOH, pH =11.9, for 90 s. The wafer was then processed as described in Run #18 above. The inverse sensitivity was 300 mJ cm$^{-2}$, the contrast was 2 and loss of he film in the unirradiated areas was 50 percent of the original thickness. The relief image was judged to be of fair quality with rounding of the edges of features.

In Run #22, the wafer was coated with a photoresist deposit as described in Run #16 of Example 14 and subsequently exposed according to the procedure of Example 15. The latent image was developed by dipping the wafer with its exposed photosensitive element into an open vessel containing Me$_4$NOH, pH=13.2, for 60 s. The wafer was then processed as described in Run #20 above. The inverse sensitivity was 75 mJ cm$^{-2}$, the contrast was 2 and the loss of film in the unirradiated areas was 10 percent of the original thickness. The relief image was judged to be good with flat tops and sharp edges. The wall profile was about 70° with respect to the plane of the substrate and holes were completely cleared out.

In Run #23, the general methods of Examples 13 and 14 were followed. A 1 μm thick photoresist deposit was prepared from a resist compounded from 6 parts of the terpolymer prepared according to procedure of Example 12 and the photoactive compound of Run #7 of Example 13, as a 20 weight % solution in DMF. The resist was irradiated and then developed by dipping the wafer into an open vessel containing aqueous KOH, pH=12.2, for 60 s. The wafer was then processed as described in Run #18 above. The inverse sensitivity was 100 mJ cm$^{-2}$, the contrast was 2 and the loss of unirradiated film was less than 2 percent of the original thickness. The relief image was judged fair, with scum remaining in the bottoms of the smaller holes.

EXAMPLE 17

A silicon wafer containing a relief image prepared as described in Run #18 of Example 16 was divided in halves. One half of the wafer was baked in a convection oven for 30 minutes at 230° C. The quality of the baked and unbaked relief images were compared by scanning electron microscopy at 20,000×. The quality of the baked relief image (wall profile of sharply-defined 2 micron lines and spaces and edge acuity) appeared unchanged with respect to the unbaked image. The baked image was completely removed with 3 wt percent aqueous Me$_4$NOH. An identically treated sample was readily stripped from the wafer following baking for 30 minutes at 230° C. using N,N-dimethylformamide.

EXAMPLES 18–29

In the following Examples, the apparatus and process of Example 2 are employed except that the monomers are varied as indicated in Table IV below.

TABLE IV

| Example No. | Monomers (mole %) | | |
|---|---|---|---|
| | A | B | C |
| 18 | (CH$_2$=CH—C(O))$_2$NH$^a$ (0.5) | Styrene (0.5) | |
| 19 | maleimide (0.1) | N—methyl maleimide (0.4) | styrene (0.5) |
| 20 | " (0.2) | " (0.3) | 4-t-butyl-styrene (0.5) |
| 21 | " (0.25) | " (0.25) | 4-methyl-styrene (0.5) |
| 22 | " (0.30) | " (0.20) | 2,4-dimethyl-styrene (0.5) |
| 23 | CH$_3$C(O)—NH—C(O)—CH=CH$_2$$^b$ (0.5) | styrene (0.5) | |
| 24 | " | 4-tertbutyl-styrene (0.5) | |
| 25 | " | 2-methyl-styrene (0.5) | |
| 26 | " | 2,4-dimethyl-styrene (0.5) | |
| 27 | " | 2-chloro-styrene (0.5) | |
| 28 | " | vinylnapthalene (0.5) | |
| 29 | " | 2-methoxy- | |

TABLE IV-continued

| Example No. | Monomers (mole %) | | |
|---|---|---|---|
| | A | B | C |
| | | styrene (0.5) | |

The solvents, reaction times and temperatures as well as alkyl mercpatan chain transfer agent of Example 2 may be employed.

Footnotes

[a] may be prepared by reacting $CH_2$=CH—COCl and $CH_2$=$CHCONH_2$ in $CH_2Cl_2$ containing at least one equivalent of triethylamine (TEA).

[b] may be prepared by reacting acetyl chloride with $CH_2$=$CHCONH_2$ in $CH_2Cl_2$ and TEA.

EXAMPLES 30–41

The copolymers of Examples 18–29 are mixed with the photoactive compound of Example 11 in a suitable organic solvent such as DMF or cyclohexanone. A film is prepared as described in Example 14, imaged as described in Example 15; developed as described in Example 16 and the resulting relief image is baked and thereafter stripped as described in Example 17.

EXAMPLES 42–53

The procedure of Examples 18–29 is followed except that the photoactive compound of Example 13, Run #7 is used.

EXAMPLES 54–65

The procedure of Examples 18–29 is followed except that o-nitrobenzyl cholate is used as the photoactive compound.

EXAMPLES 66–69

In the following Examples, the apparatus and process of Example 1 is followed to prepare homopolymers except that the following monomers are used

| Example No. | |
|---|---|
| 66. | $CH_3-\overset{O}{\overset{\|}{C}}-\overset{H}{\overset{\|}{N}}-\overset{O}{\overset{\|}{C}}-\overset{H}{\overset{\|}{C}}=CH_2$ |
| 67. | $C_2H_5\overset{O}{\overset{\|}{C}}-\overset{H}{\overset{\|}{N}}-\overset{O}{\overset{\|}{C}}-\overset{CH_3}{\overset{\|}{C}}=CH_2$ |
| 68. | $CH_2=CH-\overset{O}{\overset{\|}{\underset{\|}{C}}}-\overset{H}{\underset{\|}{N}}-\overset{O}{\overset{\|}{\underset{\|}{C}}}-CH=CH_2$ |
| 69[a] | (pyrrolidone-dione with =CH₂ exocyclic, N-H) |

EXAMPLE 70

Conversion of Styrene/Maleic anhydride copolymer to Styrene/Maleimide Copolymer

A. Preparation of Styrene/Maleamic acid copolymer 30 g of thoroughly dehydrated styrene/maleic anhydride copolymer (Aldrich Chemical Co.) were placed in a round bottom flask equipped with a gas inlet tube, magnetic stirrer and a heating bath. 220 mL of 1,4-dioxane were added to the flask and the temperature of the vigorously stirred solution was raised to 70°–75° C. Anhydrous ammonia was introduced above the stirred solution while the temperature was maintained at 70°–80° C. for two hours. The solution was cooled to room temperature under an ammonia atmosphere and the solvent was removed under vacuum. The solid residue of amide-acid was vacuum dried. A quantitative yield was obtained.

B. Preparation of Styrene/maleimide copolymer 5.0 g of Styrene/maleamic acid and 0.5 g of anhydrous sodium acetate were added to 50 mL of acetic anhydride in a round bottom flask equipped with an inert gas inlet tube, magnetic stirrer and a heating bath. The resulting solution was heated and maintained at 80°–85° C. under nitrogen for 3 hr. The cooled solution was poured in a slow stream into a well stirred beaker of 400 ml cold (5°–10° C.) water. The resulting solid was collected by suction filtration, washed with four portions of acidic (1 mL acetic acid per 200 mL of water) ice water and vacuum dried. Nearly quantitative yields of product were obtained.

EXAMPLE 71

Synthesis of Itaconimide

In a manner analogous to the procedure of Example 70 itaconic anhydride (available from Eastman Kodak) is contacted with excess anhydrous ammonia for a time sufficient to form the amide-acid which is thereafter heated with anhydrous sodium acetate in acetic anhydride for a time sufficient to form itaconimide.

We claim:

1. A positive photoresist composition comprising a mixture of
   (a) about 65–99 weight percent of a copolymer prepared from

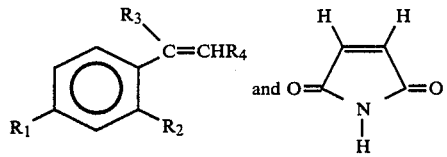

wherein the maleimide moiety is present in an amount of at least 10 mol percent based on the mol amount of co-monomers in the copolymer so as to render the copolymer soluble in an aqueous alkaline developer solution, wherein $R_1$ and $R_4$ are independently H or ($C_1$–$C_5$) alkyl; and
   (b) about 1–35 weight percent of a photoactive compound, which, upon exposure to actinic radiation, is transformed into compounds containing acidic groups that are more soluble in aqueous alkaline developers than the photoactive compound before exposure.

2. The composition of claim 1 in which the copolymer is a terpolymer that includes from about 10 to about 50 mol percent based on the mol amount of co-monomers in the copolymer of

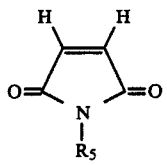

wherein $R_5$ is $(C_1-C_5)$ alkyl.

3. The positive photoresist composition of claim 1 wherein said styrene and said maleimide are in the molar ratio of about 1:1.

4. The positive photoresist composition of claim 1 wherein the photoactive compound upon exposure to actinic radiation is converted into a compound containing carboxylic acid moieties.

5. The positive photoresist composition of claim 1 wherein the photoactive compound is an ester of naphthoquinone diazide sulfonic acid.

6. The positive photoresist composition of claim 5 wherein said ester is selected from compounds having the formulae:

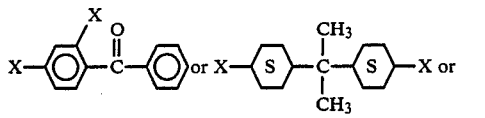

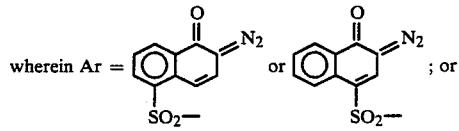

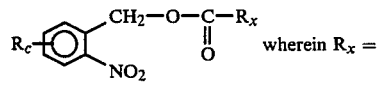

7. The positive photoresist composition of claim 1, wherein the mixture comprises about 75-92 weight percent of the copolymer and about 8-25 weight percent of the photoactive compound.

8. The positive photoresist composition of claim 1 wherein the copolymer comprises about 40 mole % of maleimide and about 10 mole % of N-($C_1-C_5$alkyl)-maleimide and the balance being a styrene unit.

9. An alkali-insoluble positive photoresist composition comprising a mixture of
(a) about 1-35 weight percent of a photoactive transformed into compounds containing acidic groups that are more soluble in aqueous alkaline developers than the photoactive compound before exposure; and
(b) about 65-99 weight percent of a polymer comprising a copolymer formed from polymerization of a film-forming monomer selected from styrene, a-methylstyrene, 4-($C_1-C_5$ alkyl) styrene, 2-($C_1-C_5$ alkyl) styrene, 2,4-di($C_1-C_5$ alkyl) styrene or a monomer having the formula $H_2C=CR_aM$ and at least about 10 mol percent maleimide based on the mol about of co-monomers in the copolymer to render the copolymer soluble in an aqueous alkaline developer solution, wherein M is CN or $CO_2R_b$, wherein $R_b$ is methyl or allyl and wherein $R_a$ is H or methyl.

10. The composition of claim 9 in which the copolymer is a terpolymer that includes from about 10 to about 50 mol percent based on the mol about of co-monomers in the copolymer

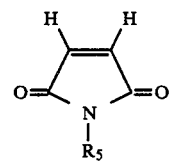

wherein $R_5$ is $(C_1-C_5)$ alkyl.

11. The positive photoresist composition suitable for application onto a substrate, comprising the composition of claim 9 and a suitable organic solvent.

12. A photosensitive element comprising a substrate bearing a layer of a photoresist composition comprising a mixture of
(a) about 65-99 percent of a copolymer prepared from

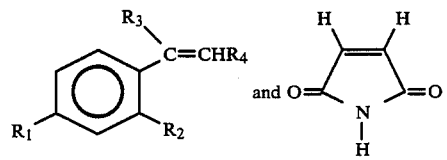

wherein the maleimide moiety is present in an amount of at least 10 mol percent based on the mol amount of co-monomers in the copolymer so as to render the copolymer soluble in an aqueous alkaline developer solution wherein $R_1$ to $R_4$ are independently H or $(C_1-C_5)$ alkyl, and
(b) about 1-35 weight percent of photoactive compound, which, upon exposure to actinic radiation, is transformed into compounds containing acidic groups that are more soluble in aqueous alkaline developers than the photoactive compound before exposure.

13. The element of claim 12 in which the copolymer is a terpolymer that includes from about 10 to about 50 mol percent based on the mol amount of co-monomers in the copolymer of

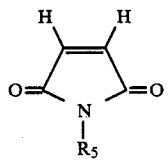

wherein $R_5$ is $(C_1-C_5)$ alkyl.

* * * * *